(12) United States Patent
Kanda (10) Patent No.: US 7,316,886 B2
(45) Date of Patent: Jan. 8, 2008

(54) PROTECTIVE FILM-FORMING COMPOSITION FOR IMMERSION EXPOSURE AND PATTERN-FORMING METHOD USING THE SAME

(75) Inventor: Hiromi Kanda, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 11/151,319

(22) Filed: Jun. 14, 2005

(65) Prior Publication Data

US 2005/0277059 A1 Dec. 15, 2005

(30) Foreign Application Priority Data

Jun. 14, 2004 (JP) .................... P. 2004-175577

(51) Int. Cl.
*G03F 7/00* (2006.01)
*G03F 7/004* (2006.01)

(52) U.S. Cl. ................... 430/270.1; 430/273.1

(58) Field of Classification Search ............. 430/270.1, 430/273.1
See application file for complete search history.

(56) References Cited

U.S. PATENT DOCUMENTS

| | | | | |
|---|---|---|---|---|
| 4,591,887 A * | 5/1986 | Arbree et al. ............... | 503/200 |
| 5,972,457 A * | 10/1999 | Matsuishi et al. .......... | 428/64.1 |
| 6,391,521 B1 * | 5/2002 | Ito et al. .................... | 430/270.1 |
| 6,627,391 B1 * | 9/2003 | Ito et al. .................... | 430/322 |
| 6,756,180 B2 * | 6/2004 | Li et al. .................... | 430/270.1 |
| 2002/0146638 A1 * | 10/2002 | Ito et al. .................... | 430/270.1 |
| 2003/0075708 A1 | 4/2003 | Kodama | |
| 2004/0133905 A1 * | 7/2004 | Aramaki et al. ............ | 720/718 |
| 2004/0192548 A1 * | 9/2004 | Hara .......................... | 503/201 |
| 2004/0234890 A1 * | 11/2004 | Leon et al. ................. | 430/273.1 |
| 2004/0234891 A1 * | 11/2004 | Leon et al. ................. | 430/278.1 |
| 2005/0186516 A1 * | 8/2005 | Endo et al. ................ | 430/322 |
| 2005/0202347 A1 * | 9/2005 | Houlihan et al. ........... | 430/311 |
| 2005/0233254 A1 * | 10/2005 | Hatakeyama et al. ....... | 430/311 |

FOREIGN PATENT DOCUMENTS

| | | | |
|---|---|---|---|
| EP | 748700 A1 * | 12/1996 |
| EP | 1164434 A2 | 12/2001 |
| EP | 1273969 A2 | 1/2003 |
| EP | 1334778 A2 | 8/2003 |
| EP | 1415974 A1 | 5/2004 |
| EP | 1455230 A2 | 9/2004 |
| EP | 1564592 A1 | 8/2005 |
| JP | 57-153433 A | 9/1982 |
| JP | 7-220990 A | 8/1995 |
| JP | 10-303114 A | 11/1998 |

(Continued)

OTHER PUBLICATIONS

B.J. Lin, "Semiconductor Foundry, Lithography, and Partners", Proceedings of SPIE, vol. 4688, No. 11, 2002, pp. 11-24.

(Continued)

*Primary Examiner*—Amanda Walke
(74) *Attorney, Agent, or Firm*—Sughrue Mion Pllc.

(57) ABSTRACT

A protective film-forming composition for immersion exposure comprises a water-insoluble and alkali-soluble resin comprising a repeating unit derived from a monomer having an acid dissociation constant pKa of 8 or more.

6 Claims, 1 Drawing Sheet

FOREIGN PATENT DOCUMENTS

| WO | WO 00/67072 | 11/2000 |
| WO | WO 2005/069076 A1 | 7/2005 |
| WO | WO 2005/081063 A1 | 9/2005 |

OTHER PUBLICATIONS

J.A. Hoffnagle, et al, "Liguid Immersion Deep-Ultraviolet Interferometric Lithography", J. Vac. Sci. Technol. B, vol. 17, No. 6, Nov./Dec. 1999, pp. 3306-3309.

Sato M. "TOK Resist & Material Development Status for Immersion Lithography" Internet Article, 'Online! Jan. 24, 2004, pp. 1-20, XP002350074; Retrieved from URL: www.sematech.org/resources/litho/meetings/forum/20040128/presentations/06_193_Sato_TOK.pdf> on Oct. 18, 2005.

Bourov A et al. "Immersion Microlithography at 193 nm with a Talbot Prism Interferometer" Proceedings of the Spie—the International Society for Optical Engineering Spie—Int. Soc. Opt. Eng USA, vol. 5377, No. 1, 2004, pp. 1573-1578, XP002350073.

* cited by examiner

Fig. 1

PROTECTIVE FILM-FORMING COMPOSITION FOR IMMERSION EXPOSURE AND PATTERN-FORMING METHOD USING THE SAME

BACKGROUND OF THE INVENTION

1. Field of the Invention

The present invention relates to a protective film forming composition used in a manufacturing process of semiconductor devices, such as IC, manufacture of circuit substrates for liquid crystals, thermal heads and the like, and lithographic process of other photo-fabrication, and also the invention relates to a pattern-forming process using the composition. In particular, the invention relates to a protective film-forming composition suitable for exposure with an immersion projection exposure apparatus using far ultraviolet rays of 300 nm or less as the light source, and a pattern-forming process using the composition.

2. Description of the Related Art

With the progress of fining of semiconductor elements, shortening of the wavelengths of exposure light source and increasing of the numerical aperture (high NA) of projection lens have advanced, and now exposure apparatus of NA 0.84 using an ArF excimer laser having the wavelength of 193 nm as the light source have been developed. As generally known, these can be expressed by the following equations:

$$(Resolution) = k_1 \cdot (\lambda/NA)$$

$$(Depth\ of\ focus) = \pm k_2 \cdot \lambda/NA^2$$

wherein $\lambda$ is the wavelength of exposure light source, NA is the numerical aperture of the projection lens, $k_1$ and $k_2$ are the coefficients concerning the process.

For further higher resolution by the shortening of wavelengths, an exposure apparatus with an $F_2$ excimer laser having the wavelength of 157 nm as the light source has been studied, but the materials of lens for use in the exposure apparatus for shortening of wavelengths and the materials of resist are extremely restricted, so that the realization of the reasonable manufacturing costs of the apparatus and materials and quality stabilization are very difficult, as a result, there are possibilities of missing an exposure apparatus and a resist having sufficient performances and stabilities within a required period of time.

As a technique for increasing resolution in optical microscopes, a so-called immersion method of filling a liquid of high refractive index (hereinafter also referred to as "immersion liquid") between a projection lens and a sample has been conventionally known.

As "the effect of immersion", the above resolution and depth of focus can be expressed by the following equations in the case of immersion, taking $\lambda_0$ as the wavelength of the exposure light in the air, n as the refractive index of immersion liquid to the air, and $NA_0 = \sin\theta$ with $\theta$ as convergence half angle of the ray of light:

$$(Resolution) = k_1 \cdot (\lambda_0/n)/NA_0$$

$$(Depth\ of\ focus) = \pm k_2 \cdot (\lambda_0/n)/NA_0^2$$

That is, the effect of immersion is equivalent to the case of using exposure wavelength of the wavelength of 1/n. In other words, in the case of the projection optical system of the same NA, the depth of focus can be made n magnifications by immersion. This is effective for every pattern form, further, this can be combined with super resolution techniques such as a phase shift method and a deformation lighting method now under discussion.

As the example of apparatus applying this effect to the transfer of micro-fine image pattern of semiconductor element, JP-A-57-153433 and JP-A-7-220990 are known, but resists suitable for immersion exposure techniques are not disclosed in these patents.

It is appointed in JP-A-10-303114 that the control of the refractive index of an immersion liquid is important as the variation of the refractive index of an immersion liquid causes the deterioration of a projected image due to the wave surface aberration of exposure apparatus, and controlling the temperature coefficient of the refractive index of an immersion liquid to a certain range, and water added with additives for reducing surface tension or increasing the degree of surface activity are disclosed as a preferred immersion liquid. However, the specific additives are not disclosed and resists suitable for the technique of immersion exposure are not also discussed.

The latest technical progress of immersion exposure is reported in *SPIE Proc.*, 4688, 11 (2002), and *J. Vac. Sci. Tecnol. B*, 17 (1999). When an ArF excimer laser is used as the light source, it is thought that pure water (refractive index of 1.44 at 193 nm) is most promising in the light of the safety in handling, the transmittance and the refractive index at 193 nm.

When an $F_2$ excimer laser is used as the light source, a solution containing fluorine is discussed from the balance of the transmittance and the refractive index at 157 nm, but a sufficiently satisfactory solution from the viewpoint of the environmental safety and at the point of refractive index has not been found yet. From the extent of the effect of immersion and the degree of completion of resist, it is thought that immersion exposure technique will be carried on an ArF exposure apparatus earliest.

From the advent of the resist for a KrF excimer laser (248 nm) on, an image-forming method that is called chemical amplification is used as the image-forming method of the resist for compensating for the reduction of sensitivity by light absorption. To explain the image-forming method of positive chemical amplification by example, this is an image-forming method of exposing a resist to decompose an acid generator in the exposed area to thereby generate an acid, utilizing the generated acid as the reactive catalyst to change an alkali-insoluble group to an alkali-soluble group by the bake after exposure (PEB: Post Exposure Bake), and removing the exposed area by alkali development.

In immersion exposure, a resist film is exposed through a photomask in the state of filling an immersion liquid between the resist film and the optical lens, to transfer the pattern of the photomask to the resist film. At this time, there are cases where an image is not formed by the osmosis of an immersion liquid into the inside of a resist film (Nikkei Micro-device, April, 2004). Further, it is imagined that organic substances and the like are eluted from a resist film and get into an immersion liquid as impurities and contaminate a lens and an exposure apparatus to thereby hinder exposure.

As a solution to avoid such problems, a method of providing a protective film between a resist film and a lens (hereinafter referred to as "a topcoat" or "an overcoat") so that a resist and water do not come in contact directly is known (e.g., Nikkei Micro-device, April, 2004).

However, the materials having sufficiently satisfactory performances for use as the topcoat are not found yet.

SUMMARY OF THE INVENTION

The objects of the invention are to provide a protective film-forming composition capable of forming on a resist film a protective film soluble in an alkali developing solution, capable of peeling off by an alkali developing solution used in a development process while protecting the resist film from an immersion liquid in pattern formation by immersion exposure, and capable of forming a good pattern, and to provide a method of forming a pattern for immersion exposure by using the composition.

The above objects of the invention are solved by the following protective film-forming composition and a pattern forming method using the same.

(1) A protective film-forming composition for immersion exposure containing a water-insoluble and alkali-soluble resin containing a repeating unit derived from a monomer having an acid dissociation constant pKa of 8 or more.

(2) The protective film-forming composition for immersion exposure as described in the above item (1), wherein the repeating unit derived from a monomer has a fluoro-alcohol group.

(3) The protective film-forming composition for immersion exposure as described in the above item (1) or (2), wherein the repeating unit derived from a monomer has 2 or more acid groups.

(4) The protective film-forming composition for immersion exposure as described in the above item (1), (2) or (3) further contains a surfactant.

(5) A pattern-forming method comprising the processes of forming a resist film on a substrate, forming a protective film from the protective film-forming composition as described in any of the above items (1) to (4) on the resist film, immersion exposing and developing the resist film.

DETAILED DESCRIPTION OF THE INVENTION

The invention is described in detail below.

(1) A water-insoluble and alkali-soluble resin containing a repeating unit derived from a monomer having an acid dissociation constant pKa of 8 or more:

A protective film-forming composition for immersion exposure in the invention contains a water-insoluble and alkali-soluble resin (hereinafter the resin is also referred to as resin (X)) containing a repeating unit derived from a monomer having an acid dissociation constant pKa of 8 or more.

The repeating unit contained in resin (X) is a repeating unit formed by polymerization of a monomer having an acid dissociation constant pKa of 8 or more.

Acid dissociation constant pKa is described in *Kagaku Binran II (Chemical Handbook II)*, 4th Edition (revised version), compiled by Nippon Kagaku-kai, published by Maruzen Co (1993). The pKa value of monomers can be measured with, e.g., an infinite dilution solution at 25° C.

The monomer having pKa of 8 or more is not particularly restricted, and monomers having an acid group (an alkali-soluble group), e.g., a phenolic hydroxyl group, a sulfonamide group, —COCH$_2$CO—, and a fluoro-alcohol group are exemplified. Monomers containing a fluoro-alcohol group are particularly preferred. The fluoro-alcohol group is a fluoroalkyl group on which at least one hydroxyl group is substituted, preferably having from 1 to 10 carbon atoms, more preferably from 1 to 5 carbon atoms. As the specific examples of the fluoro-alcohol groups, e.g., —CF$_2$OH, —CH$_2$CF$_2$OH, —CH$_2$CF$_2$CF$_2$OH, —C(CF$_3$)$_2$OH, —CF$_2$CF(CF$_3$)OH, and —CH$_2$C(CF$_3$)$_2$OH can be exemplified. The particularly preferred fluoro-alcohol group is a hexafluoroisopropanol group.

The monomer having pKa of 8 or more may contain only one acid group or may contain two or more acid groups. The repeating unit derived from the monomer preferably has two or more groups per one repeating unit, more preferably from 2 to 5 acid groups, and particularly preferably from 2 to 3 acid groups.

The pKa of the monomer having pKa of 8 or more is preferably from 8 to 13. By containing resin (X) containing the repeating unit derived from the monomer having pKa of 8 or more, preferably from 8 to 13, smooth solubility can be obtained even when a weak basic alkali developing solution is used.

It is preferred that resin (X) is transparent in the exposure light source to be used so that the light reach a resist film through a protective film at exposure time. When resin (X) is used in ArF immersion exposure, it is preferred that resin (X) does not have an aromatic group in view of the transparency to ArF light.

The preferred specific examples of the repeating units derived from the monomer having pKa of 8 or more contained in resin (X) are shown below, but the invention is not limited to these compounds.

Besides the repeating structure unit derived from the monomer having pKa of 8 or more, resin (X) may have other repeating structure units. As monomers forming other repeating structure unit, compounds having one addition polymerizable unsaturated bond selected from, e.g., acrylic esters, methacrylic esters, acrylamides, methacrylamides, allyl compounds, vinyl ethers and vinyl esters, can be exemplified. In addition to these compounds, addition polymerizable unsaturated compounds copolymerizable with the monomers corresponding to the above various kinds of repeating structure units may be copolymerized.

By containing the repeating unit derived from the monomer having pKa of 8 or more, resin (X) in the invention becomes excellent in the compatibility of insolubility in water and solubility in an alkali developing solution. In resin (X), the content of the repeating unit derived from the monomer having pKa of 8 or more is preferably from 10 to 100 mol %, more preferably from 20 to 100 mol %.

The preferred specific examples of resin (X) containing the repeating unit derived from the monomer having an acid dissociation constant pKa of 8 or more are shown below, but the invention is not limited to these compounds.

(A-8)

(A-9)

(A-10)

(A-11)

(A-12)

(A-13)

(A-14)

(A-15)

(A-16)

(A-17)

(A-18)

(A-19)

(A-20)

By the presence of a protective film containing water insoluble resin (X) between a resist film and an immersion liquid, osmosis of the immersion liquid into the inside of the resist film and elution of the resist components into the immersion liquid can be prevented, so that a proper pattern can be obtained in pattern forming by immersion exposure.

Further, since resin (X) is alkali-soluble, it is possible to easily resolve and remove the protective film in the alkali development process without providing a special peeling process of the protective film.

When a solution obtained by dissolving a resin in a solvent is coated on a silicon wafer and dried, the dried resin film is soaked in pure water at 23° C. for 10 minutes, then dried, and the thickness of the film is measured, if the thickness does not decrease, the property is "water-insoluble".

Further, "alkali-soluble" means that a resin is soluble in an alkali developing solution for use in development in pattern forming by resist, that is, when a solution obtained by dissolving the resin in a solvent is coated on a silicon wafer and dried, the dried film is treated with a 2.38 mass % tetramethylammonium hydroxide aqueous solution at 23° C. for 30 seconds, rinsed with pure water for 30 seconds and dried, and the film thickness is measured, if the thickness is zero, the property is "alkali-soluble".

Resin (X) can be synthesized according to ordinary method (e.g., radical polymerization).

For example, as a general synthesizing method, a monomer seed is put in a reaction vessel en bloc or during the reaction, dissolved homogeneously with a reaction solvent according to necessity, such as ethers, e.g., tetrahydrofuran, 1,4-dioxane, or diisopropyl ether, ketones, e.g., methyl ethyl ketone or methyl isobutyl ketone, ester solvents, e.g., ethyl acetate, or the later-described solvents for use for dissolving the composition of the invention, e.g., propylene glycol monomethyl ether acetate, heated according to necessity under inert gas atmosphere, e.g., nitrogen or argon, and polymerization is initiated with a commercially available radical polymerization initiator (e.g., azo initiator or peroxide). If desired, the initiator is added all at one time or dividedly, and after reaction termination, the reactant is put in a solvent and a desired polymer is recovered as powder or solid. The concentration of reaction is generally 20 mass % or more, preferably 30 mass % or more, and more preferably 40 mass % or more. The reaction temperature is generally from 10 to 150° C., preferably from 30 to 120° C., and more preferably from 50 to 100° C.

The synthesis of resin (X) is not limit to the radical polymerization and various synthesizing methods can be used, e.g., cationic polymerization, anionic polymerization, addition polymerization, cyclic polymerization, polyaddition, polycondensation and addition condensation can be used for the synthesis of resin (X) besides the radical polymerization.

In addition, commercially available various resins can also be used.

The repeating structure units may be used alone, or a plurality of the repeating units may be used as mixture. In the invention, resins may be used alone or a plurality of resins may be used in combination.

The weight average molecular weight of resin (X) in terms of polystyrene by a gas permeation chromatography (GPC) method is preferably 1,000 or more, more preferably from 1,000 to 200,000, and still more preferably from 3,000 to 20,000.

In resin (X), the residual monomer is preferably 5 mass % or less in view of the inhibition of eluate and the like, more preferably the residual monomer is 3 mass % or less.

The molecular weight distribution (Mw/Mn, also referred to as the degree of dispersion) is generally in the range of from 1 to 5, preferably from 1 to 4, and more preferably from 1 to 3.

In the protective film-forming composition of the invention, the blending amount of resin (X) is preferably from 60 to 100 mass % of the total solids content of the protective film-forming composition, more preferably from 70 to 100 mass %.

In general, the protective film-forming composition of the invention contains a solvent and, if necessary, can contain a surfactant and other components. Each of these components is described below.

(2) Solvent

The protective film-forming composition for immersion exposure in the invention is generally prepared by solving these components in a prescribed organic solvent. It is preferred that the solvent is different from the organic solvent used in a resist to avoid the admixture with the resist. In view of the prevention of elution into an immersion liquid, the solvent is preferably a nonaqueous solvent. The solvent having a boiling point of from 100 to 200° C. is preferred.

In the invention, solvents may be used alone or two or more solvents may be used as mixture.

As usable solvents, for example, the following solvents are exemplified.

Hydrocarbon solvents, e.g., benzene, toluene, ethylbenzene, amylbenzene, isopropylbenzene, hexane, heptane, octane, nonane, decane, dodecane, cyclohexane, methylcyclohexane, p-menthane, decalin, xylene, cyclohexylbenzene, cyclohexene, cyclopentane, dipentene, naphthalene, dimethylnaphthalene, cymene, tetralin, biphenyl, mesitylene, etc.;

Halogenated hydrocarbon solvents, e.g., methylene chloride, hexyl chloride, chlorobenzene, bromobenzene, etc.;

Alcohols, e.g., amyl alcohol, isoamyl alcohol, butanol, hexanol, 3-heptanol, i-butyl alcohol, 2-ethylbutanol, 2-ethylhexanol, octanol, nonanol, neopentyl alcohol, cyclohexanol, tetrahydrofurfuryl alcohol, etc.;

Nitrogen-containing solvents, e.g., acetonitrile, isopropanolamine, ethylhexylamine, N-ethylmorpholine, diisopropylamine, cyclohexylamine, di-n-butylamine, tetramethylethylenediamine, tripropylamine, etc.;

Carboxylic acid solvents, e.g., formic acid, acetic acid, butyric acid, isobutyric acid, itaconic acid, propionic acid, etc.;

Acid anhydride solvents, e.g., acetic anhydride, propionic anhydride, itaconic anhydride, etc.;

Fluorine solvents, e.g., 1,4-difluorobenzene, 1,1,2,2-tetrachlorodifluoroethane, tetrafluoropropanol, ethyl trifluoroacetoacetate, perfluoroheptane, hexafluoro-isopropanol, perfluorobutylethanol, pentafluoropropanol, hexafluorobenzene, perfluorobutyltetrahydrofuran, perfluoropolyethers, fluorophenols, etc.; and Other solvents, e.g., anisole, dioxane, dioxolan, dibutyl ether, ethyl-n-butyl ketone, diacetone alcohol, diisobutyl ketone, methyl isobutyl ketone, methyl-n-butyl ketone, ethylene glycol, diglycidyl ether, ethylene dichloride, cyclohexanone, cyclopentanone, 2-heptanone, γ-butyrolactone, methyl ethyl ketone, ethylene glycol, ethylene glycol monomethyl ether, ethylene glycol monoethyl ether, 2-methoxyethyl acetate, ethylene glycol monoethyl ether acetate, propyelen glycol, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethyl sulfoxide, N-methylpyrrolidone, methoxybutanol, tetrahydrofuran, ethylethoxy propionate, butyl acetate, and N,N-dimethylacetamide.

(3) Surfactant

The protective film-forming composition in the invention can further contain a surfactant. It is preferred to contain either one or two or more of fluorine and/or silicon surfactants (a fluorine surfactant, a silicon surfactant, a surfactant containing both a fluorine atom and a silicon atom). Containing the surfactant contributes to the improvement of performances, such as sensitivity, resolution, adhesion, prevention of development failure, in particular, a uniform coating property at the time of using an exposure light source of 250 nm or lower, particularly 220 nm or lower.

As the fluorine and/or silicon surfactants, those disclosed, e.g., in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862, U.S. Pat. Nos. 5,405,720, 5,360,692, 5,529,881, 5,296,330, 5,436,098, 5,576,143, 5,294,511 and 5,824,451 are exemplified. The following commercially available surfactants can also be used as they are.

As the fluorine or silicon surfactants usable in the invention, Eftop EF301 and EF303 (manufactured by Shin-Akita Kasei Co., Ltd.), Fluorad FC 430 and 431 (manufactured by Sumitomo 3M Limited), Megafac F171, F173, F176, F189 and R08 (manufactured by Dainippon Ink and Chemicals Inc.), Sarfron S-382, SC101, 102, 103, 104, 105 and 106 (manufactured by ASAHI GLASS CO., LTD.), and Troy Sol S-366 (manufactured by Troy Chemical Co., Ltd.) are exemplified. Further, polysiloxane polymer KP-341 (manufactured by Shin-Etsu Chemical Co., Ltd.) can also be used as a silicon surfactant.

As surfactants, in addition to the above-shown well-known surfactants, surfactants using polymers having fluoro-aliphatic groups derived from fluoro-aliphatic compounds manufactured by a telomerization method (also called a telomer method) or an oligomerization method (also called an oligomer method) can be used. Fluoro-aliphatic compounds can be synthesized by the method disclosed in JP-A-2002-90991.

As polymers having fluoro-aliphatic groups, copolymers of monomers having fluoro-aliphatic groups and (poly(oxyalkylene)) acrylate and/or (poly(oxyalkylene))methacrylate are preferred, and these copolymers may be irregularly distributed or may be block copolymerized. As the poly(oxyalkylene) groups, a poly(oxyethylene) group, a poly(oxypropylene) group and poly(oxybutylene) group are exemplified. Further, the polymers may be units having alkylene different in a chain length in the same chain length, such as a block combination of poly(oxyethylene and oxypropylene and oxyethylene), and a block combination of poly(oxyethylene and oxypropylene). In addition, copolymers of monomers having fluoro-aliphatic groups and poly(oxyalkylene) acrylate (or methacrylate) may be not only bipolymers but also terpolymers or higher copolymers obtained by copolymerization of monomers having different two or more kinds of fluoro-aliphatic groups or different two or more kinds of poly(oxyalkylene) acrylates (or methacrylates) at the same time.

For example, as commercially available surfactants, Megafac F178, F470, F473, F475, F476 and F472 (manufactured by Dainippon Ink and Chemicals Inc.) can be exemplified. Further, copolymers of acrylate (or methacrylate) having a $C_6F_{13}$ group and (poly(oxyalkylene))acrylate (or methacrylate), copolymers of acrylate (or methacrylate) having a $C_6F_{13}$ group, (poly(oxyethylene))acrylate (or methacrylate), and (poly-(oxypropylene)) acrylate (or methacrylate), copolymers of acrylate (or methacrylate) having a $C_8F_{17}$ group and (poly-(oxyethylene)) acrylate (or methacrylate), copolymers of acrylate (or methacrylate) having a $C_8F_{17}$ group, (poly(oxy-ethylene)) acrylate (or methacrylate), and poly(oxypropylene)acrylate (or methacrylate) are exemplified.

In the invention, surfactants other than fluorine and/or silicon surfactants can also be used. Specifically, nonionic surfactants, such as polyoxyethylene alkyl ethers, e.g., polyoxyethylene lauryl ether, polyoxyethylene stearyl ether, polyoxyethylene cetyl ether, and polyoxyethylene oleyl ether, polyoxyethylene alkylallyl ether, e.g., polyoxyethylene octylphenol ether and polyoxyethylene nonylphenol ether, polyoxyethylene-polyoxypropylene block copolymers, sorbitan fatty acid esters, e.g., sorbitan monolaurate, sorbitan monopalmitate, sorbitan monostearate, sorbitan monooleate, sorbitan trioleate, and sorbitan tristearate, and polyoxyethylene sorbitan fatty acid esters, e.g., polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate can be exemplified.

These surfactants may be used alone or some kinds may be used in combination.

The use amount of surfactants is preferably from 0.0001 to 2 mass % to the total amount of the protective film-forming composition for immersion exposure (excluding solvents), more preferably from 0.001 to 1 mass %.

(4) Protective Film

The protective film-forming composition for immersion exposure in the invention is formed on a resist film by, e.g., coating, to form a protective film for the purpose of prevention of the osmosis of an immersion liquid into the resist film and the elution of the resist components to the immersion liquid. The coating means is not particularly restricted and arbitrarily selected according to the process, e.g., a means of spin coating can be used.

From the viewpoint that a protective film is preferably transparent to the exposure light source, a thinner film is preferred and generally the thickness is from 1 to 300 nm, preferably from 10 to 150 nm. Specifically, the film thickness is such that the transmission of the exposure light of the film becomes preferably from 50 to 80%, more preferably from 60 to 70%. The transmission of exposure light can be adjusted by adjusting the polymerization components of the resin. For example, the transmission of ArF light can be increased by the decrease of the amount of aromatic rings contained in the resin.

Further, for preventing an immersion liquid and lens from being contaminated by the eluate from a protective film, it is preferred that there is no eluate from a protective film. For the purpose of preventing the eluate, the content of a low molecular weight compound (e.g., a compound having a molecular weight of 1,000 or less) in a protective film is preferably less.

From the viewpoint of the affinity with an immersion liquid, the contact angle (at 23° C.) of an immersion liquid to a protective film is preferably from 50 to 80°, more preferably from 60 to 80°. The contact angle can be adjusted to the above range by the adjustment of the amount of acid groups or by controlling the hydrophilic-hydrophobic property of the copolymer component.

The refractive index of a protective film is preferably close to the refractive index of a resist film from the viewpoint of resolution. The adjustment of the refractive index can be carried out by the control of the components of a protective film-forming composition, particularly the resin composition, and the ratio of repeating units.

Protective film-forming compositions capable of being uniformly coated in forming a protective film are preferably used. A coating property (coating uniformity) can be improved by the selection of the kinds of solvents, surfactants and other additives and the adjustment of the addition amounts of these compounds.

It is preferred for the resist pattern formed not to have electric conductivity and, at the same time, a protective film-forming composition for immersion exposure does not contain metals. The amount of metals contained in a protective film-forming composition is preferably 100 ppb or less, more preferably 50 ppb or less. The amount of metals can be controlled by general purification, e.g., the improvement of the purity of materials used and by filtration.

A protective film-forming composition for immersion exposure is coated on a resist film to thereby form a protective film, so that it is preferably a composition not admix with a resist film.

(5) Pattern-Forming Method

The above components of the protective film-forming composition for immersion exposure in the invention are generally dissolved with a solvent and coated on a resist film on a substrate.

That is, a resist composition for immersion exposure is coated on such a substrate as is used in the manufacture of a precision integrated circuit element by a proper coating method (e.g., by a spinner or a coater) in an optional thickness (generally from 50 to 500 nm). At this time, it is also preferred to provide an appropriate reflection preventing film on a substrate and then form a resist film thereon. After coating, the coated film is dried by spin or baking, thereby a resist film is formed.

Further, similarly to the resist composition, a protective film-forming composition for immersion exposure is coated on the resist film with a spinner or a coater, dried by spin or baking to form a protective film.

Subsequently, the resist is subjected to exposure through a mask via an immersion liquid (immersion exposure) for pattern forming. Exposure amount can be arbitrarily set but generally the amount is from 1 to 100 mJ/cm$^2$. After exposure, preferably spin or/and baking are carried out, followed by development and rinsing, thereby a pattern is obtained. In the invention, a protective film is dissolved in a developing solution during a development process and peeled off, so that a special peeling process need not be provided.

It is preferred to perform baking after exposure, and the temperature of baking is generally from 30 to 300° C. From the viewpoint of the change of the line width of resist pattern due to the fluctuation of post exposure time delay (PED) from the exposure to development process, the time from exposure to baking process is preferably shorter.

As exposure light, far ultraviolet rays of preferably 250 nm or less, more preferably 220 nm or less, are used. Specifically, a KrF excimer laser (248 nm), an ArF excimer laser (193 nm), an F$_2$ excimer laser (157 nm), and an X-ray are exemplified.

As the substrates that can be used, a generally used Bare Si substrate, an SOG substrate or a substrate with a reflection preventing film can be exemplified.

As the reflection preventing films, inorganic film types, e.g., titanium, titanium dioxide, titanium nitride, chromium oxide, carbon and α-silicon, and organic film types, e.g., films comprising light absorbers and polymer materials can be used. The former necessitates equipments such as a vacuum evaporation apparatus, a CVD apparatus, or a sputtering apparatus in film forming. As organic reflection preventing films, e.g., those comprising condensation products of diphenylamine derivatives and formaldehyde-modified melamine resins, alkali-soluble resins and light absorbers as disclosed in JP-B-7-69611, reaction products of maleic anhydride copolymers and diamine-type light absorbers as disclosed in U.S. Pat. No. 5,294,680, those containing resin binders and methylolmelamine series thermal crosslinking agents as disclosed in JP-A-6-118631, acrylic resin type reflection preventing films having a carboxylic acid group, an epoxy group and a light-absorbing group in the same molecule as disclosed in JP-A-6-118656, those comprising methylolmelamine and benzophenone light absorbers as disclosed in JP-A-8-7115, and those obtained by adding low molecular weight light absorbers to polyvinyl alcohol resins as disclosed in JP-A-8-179509 are exemplified.

As organic reflection preventing films, DUV-30 series, DUV-40 series and ARC25 manufactured by Brewer Science, and AC-2, AC-3, AR19 and AR20 manufactured by Shipley Co. can also be used.

An immersion liquid for use in immersion exposure is described below.

An immersion liquid for use in immersion exposure preferably has a temperature coefficient of refractive index as small as possible so as to be transparent to the exposure wavelength and to hold the distortion of optical image reflected on the resist to the minimum. In particular, when the exposure light source is an ArF excimer laser (wavelength: 193 nm), it is preferred to use water for easiness of availability and easy handling property, in addition to the above points.

When water is used as an immersion liquid, to reduce the surface tension of water and to increase the surface activity, a trace amount of additive (a liquid) that does not dissolve the resist layer on a wafer and has a negligible influence on the optical coating of the lower surface of a lens may be added. As such an additive, aliphatic alcohols having a refractive index almost equal to the refractive index of water is preferred, specifically methyl alcohol, ethyl alcohol and isopropyl alcohol are exemplified. By adding an alcohol having a refractive index almost equal to that of water, even if the alcohol component in water is evaporated and the concentration of the content is changed, the refractive index of the liquid as a whole can be made extremely small. On the other hand, when substances opaque to the light of 193 nm or impurities largely different from water in a refractive index are mixed, these substances bring about the distortion of the optical image reflected on the resist. Accordingly water used is preferably distilled water. Further, pure water filtered through an ion exchange filter may be used.

The electric resistance of water is preferably 18.3 MΩ·cm or higher, and TOC (concentration of organic material) is preferably 20 ppb or lower. Further, it is preferred that water has been subjected to deaeration treatment.

As the alkali developing solution for use in the development process, alkaline aqueous solutions of inorganic alkalis, e.g., sodium hydroxide, potassium hydroxide, sodium carbonate, sodium silicate, sodium metasilicate and aqueous ammonia, primary amines, e.g., ethylamine and n-propylamine, secondary amines, e.g., diethylamine and di-n-butylamine, tertiary amines, e.g., triethylamine and methyldiethylamine, alcohol amines, e.g., dimethylethanolamine and triethanol-amine, quaternary ammonium salts, e.g., tetramethylammonium hydroxide and tetraethylammonium hydroxide, and cyclic amines, e.g., pyrrole and piperidine, can be used.

An appropriate amount of alcohols and surfactants may be added to the alkali developing solutions.

The alkali concentration of alkali developing solutions is generally from 0.1 to 20 mass %.

The pH of alkali developing solutions is generally from 10.0 to 15.0.

Pure water can be used as the rinsing liquid and an appropriate amount of surfactants may be added to pure water.

After development process or rinsing process, a process to remove the developing solution or rinsing liquid on the resist pattern can be performed by supercritical fluid.

In the immersion liquid using the protective film in the invention, resists are not particularly restricted and arbitrarily selected from among those generally used, and any of positive and negative resists can be used.

Positive resists and negative resists sufficiently provided with various requisites applicable to the latest super-fine process are preferably used, and chemical amplification-type resists and positive resists are particularly preferably used in the invention.

As the chemical amplification-type resists, so-called acid generators capable of generating acid by active energy rays, e.g., light, are typically exemplified in the invention. For example, as negative chemical amplification type resists, three-component series resists comprising a base polymer, a light-acid generator and a crosslinking agent are used, and at the time of resist exposure, the acid generated on the exposed area upon irradiation with light brings about a crosslinking reaction and functions to the resist to lower the solubility in a developing solution. On the other hand, as positive chemical amplification type resists, there are generally two-component series resists comprising a base polymer having a site blocked with a protective group having a dissolution-inhibiting function and a light-acid generator, and three-component series resists comprising a base polymer, an acid generator and a dissolution-inhibiting agent, and at the time of resist exposure, the acid generated on the exposed area upon irradiation with light functions to detach the protective group of the polymer to increase the solubility in a developing solution.

When the exposure light source is an ArF excimer laser (wavelength: 193 nm), two-component resists comprising a resin capable of increasing the solubility in an alkali developing solution by the action of an acid, and a light-acid generator are preferably used. In particular, the resin capable of increasing the solubility in an alkali developing solution by the action of an acid is preferably acrylic or methacrylic resin having a monocyclic or polycyclic alicyclic hydrocarbon structure, the resin having a lactone residue or an adamantane residue is more preferred.

Since it is preferred for the resist pattern formed not to have electric conductivity, a resist preferably does not contain metals. The amount of metals contained is preferably 100 ppb or less, more preferably 50 ppb or less. The amount of metals can be controlled by general purification, e.g., the improvement of the purity of materials used and by filtration.

EXAMPLE

The invention will be described more specifically with referring to examples, but the invention is not limited thereto.

Synthesis of Resin (A-17)

4-[Bis(trifluoromethyl)hydroxymethyl]styrene (43.6 g) (0.1 mol) was dissolved in 250 ml of propylene glycol monomethyl ether, and 0.25 g of 2,2'-azobis(2,4-dimethylvaleronitrile) (V-65, trade name, manufactured by Wako Pure Chemical Industries) was added thereto as a polymerization initiator. The solution was stirred at 70° C. for 4 hours under nitrogen current. Thereafter, the reaction solution was put in 1 liter of hexane with vigorously stirring. The precipitated resin was washed with ion exchange water, filtered, and vacuum-dried, thereby 40 g of a white resin was obtained. The weight average molecular weight (in terms of polystyrene) was confirmed to be 7,000 from GPC measurement.

Each resin used in each example was synthesized in the same manner as above.

Examples 1 to 6 and Comparative Example 1

Evaluation of Suitability of Protective Film for Immersion Exposure:

Preparation of Topcoat:

A protective film-forming composition having solid content concentration of 10 mass % was prepared by dissolving the components shown in Table 1 below in a solvent, and filtrating through a polyethylene filter having a pore diameter of 0.1 μm. Each of the prepared protective film-forming compositions was evaluated in the following manner. The results obtained are shown in Table 1.

Measurement of pKa:

Of the monomers constituting the resin contained in a protective film-forming composition, the pKa of the monomer containing an acid group was measured. The measurement was carried out according to the method described in *Kagaku Binran II* (*Chemical Handbook II*), 4$^{th}$ Edition (revised version), compiled by Nippon Kagaku-kai, published by Maruzen Co (1993), with an infinite dilution solution at 25° C.

Suitability of Water Insolubility:

A protective film-forming composition was coated on a silicon wafer in a thickness of 50 nm. After drying, the wafer was soaked in pure water at 23° C. for 10 minutes, dried, and the film thickness was measured. A sample that showed the decrease of thickness of 1 nm or less was graded ○ and a sample in which the decrease was 1 nm or more was graded X.

Suitability of Alkali Solubility:

A protective film-forming composition was coated on a silicon wafer in a thickness of 50 nm. After drying, the wafer was subjected to development with an aqueous solution of 2.38% tetramethylammonium hydroxide at 23° C. for 20 minutes, rinsed with pure water for 30 seconds, dried, and the thickness was measured. A sample that showed no residual film was graded ○ and a sample in which a residual film was observed was graded X. The terms "showed no residual film" mean that the thickness is zero.

Striation:

A protective film-forming composition was coated on a silicon wafer in a thickness of 50 nm and dried. After drying, the protective film was observed with a microscope, and wet residue and the occurrence of striation were visually observed. A sample that was conspicuous in wet residue and striation was graded X, a sample in which wet residue and striation were observed a little was graded Δ, a sample in which wet residue and striation were hardly observed was ○, and a sample completely free of wet residue and striation was graded ⊙.

Striation is a phenomenon that streak-like patterns appear radially from the center of a wafer, and a thin area and a thick area of a coated film thickness are distributed alternately in radial streaks.

Coating Uniformity of In-Plane of Substrate:

A protective film-forming composition was coated on a silicon wafer in a thickness of 50 nm and dried. After drying, the thickness values of the protective film were measured at optional ten points of the silicon wafer with Alpha Step-100 (manufactured by TENVCOR). The distribution to the thickness of the target of the measured value was taken as the index of coating uniformity.

reflection preventing film having a thickness of 78 nm was formed. Each resist composition shown in Table 2 below was coated on the reflection preventing film and baked at 115° C. for 60 seconds, thereby a resist film having a thickness of 200 nm was formed. Further, in Examples 7 to 18, a protective film-forming composition (the compositions prepared in Examples 2, 4 and 5) was coated and baked at 90° C. for 60 seconds, thus a protective film having a thickness of 50 nm was formed. In Comparative Examples 2 to 5, a protective film was not formed.

Figure 1:
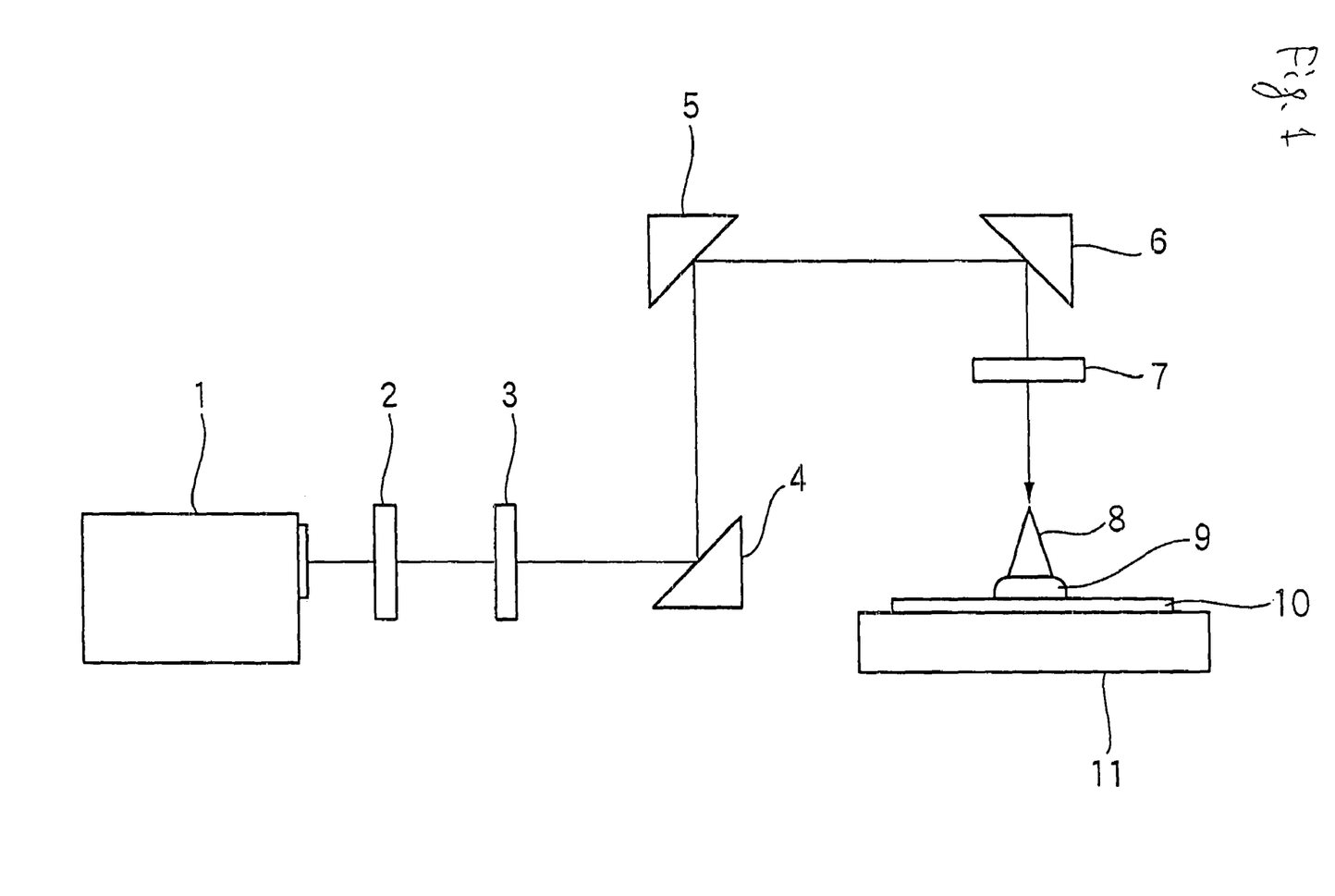
FIG. 1 is a schematic drawing of a laboratory apparatus of two-beam interference exposure.

By using water as the immersion liquid, each of the thus obtained wafers was subjected to two-beam interference exposure with the apparatus shown in FIG. 1. The wavelength of the laser was 193 nm. After heating at 130° C. for 60 seconds, the wafer was subjected to development with an aqueous solution of tetramethylammonium hydroxide (2.38 mass %) for 60 minutes, rinsed with pure water, and then drying by spin, thereby a resist pattern was obtained.

The pattern obtained was observed with a scanning electron microscope (S-9260, manufactured by Hitachi Limited). A sample that showed no collapse of pattern was graded ○ and a sample in which the pattern completely collapsed was graded X. Further, the pattern profile was observed.

In the apparatus shown in FIG. 1, 1 is a laser, 2 is a diaphragm, 3 is a shutter, 4, 5 and 6 are reflection mirrors, 7 is a condenser lens, 8 is a prism, 9 is an immersion liquid, 10 is a wafer provided with a reflection preventing film and a resist film, and 11 is a wafer stage.

TABLE 1

| Example No. | Structure | Resin (2 g) Composition Ratio*1 | Wt. Av. Mol. Wt. | pKa of Monomer | Solvent (mass %) | Surfactant (5 mg) | Suitability of Water-insolubility | Suitability of Alkali Solubility | Striation | Coating Uniformity |
|---|---|---|---|---|---|---|---|---|---|---|
| Example 1 | A-1 | 100 | 8,000 | 10 | SL-1 (100) | None | ○ | ○ | ○ | 85 |
| Example 2 | A-8 | 100 | 12,000 | 10 | SL-1 (100) | None | ○ | ○ | ○ | 83 |
| Example 3 | A-17 | 100 | 7,000 | 9 | SL-1 (40) + SL-2 (60) | None | ○ | ○ | ○ | 72 |
| Example 4 | A-19 | 100 | 5,000 | 9 | SL-1 (40) + SL-2 (60) | None | ○ | ○ | ○ | 65 |
| Example 5 | A-21 | 100 | 21,000 | 9 | SL-2 (100) | W-1 | ○ | ○ | ⊙ | ≦50 |
| Example 6 | A-28 | 50/50 | 9,000 | 9 | SL-2 (100) | W-2 | ○ | ○ | ⊙ | ≦50 |
| Comp. Ex. 1 | PMA | 100 | 10,000 | 4 | SL-2 (100) | None | X | ○ | ○ | 82 |

*1The composition ratio is the molar ratio from the left of the structural formula.

The abbreviations in Table 1 are as follows.
PMA: Polymethacrylic acid
W-1: Megafac F176 (fluorine surfactant, manufactured by Dainippon Ink and Chemicals Inc.)
W-2: Megafac R08 (fluorine and silicon surfactant, manufactured by Dainippon Ink and Chemicals Inc.)
SL-1: Propylene glycol dimethyl ether
SL-2: Perfluorobutyltetrahydrofuran Examples 7 to 18 and Comparative Examples 2 to 5

Evaluation of Immersion Liquid:

Evaluation of Image Forming:

An organic reflection preventing film ARC29A (manufactured by Nissan Chemical Industries Ltd.) was coated on a silicon wafer and baked at 205° C. for 60 seconds, and a

TABLE 2

| | | | Image Forming Property | |
|---|---|---|---|---|
| | Protective Film | Resist | Pattern Collapse | Profile |
| Example 7 | Example 2 | PR1 | ○ | Rectangular |
| Example 8 | Example 2 | PR2 | ○ | A little tapered |
| Example 9 | Example 2 | PR3 | ○ | Tapered |
| Example 10 | Example 2 | PR4 | ○ | Rectangular |
| Example 11 | Example 4 | PR1 | ○ | Rectangular |
| Example 12 | Example 4 | PR2 | ○ | Rectangular |
| Example 13 | Example 4 | PR3 | ○ | A little tapered |
| Example 14 | Example 4 | PR4 | ○ | Rectangular |
| Example 15 | Example 5 | PR1 | ○ | Rectangular |
| Example 16 | Example 5 | PR2 | ○ | Rectangular |
| Example 17 | Example 5 | PR3 | ○ | Rectangular |
| Example 18 | Example 5 | PR4 | ○ | Rectangular |

TABLE 2-continued

| | | Image Forming Property | |
|---|---|---|---|
| | Protective Film | Resist | Pattern Collapse | Profile |
| Comparative Example 2 | None | PR1 | X | — |
| Comparative Example 3 | None | PR2 | X | — |
| Comparative Example 4 | None | PR3 | X | — |
| Comparative Example 5 | None | PR4 | X | — |

The abbreviations in Table 2 are as follows.

PR1:

A resist composition described in Example 1 in JP-A-2000-275845, that is, a resist composition comprising resin P-1 shown below (weight average molecular weight: about 10,000), 0.2 parts of an acid generator (triphenylsulfonium perfluorobutanesulfonate (TPS-109, manufactured by Midori Chemical Co., Ltd.)), 0.015 parts of a basic compound (2,6-diisopropylaniline), and solvents (47.5 parts of propylene glycol monomethyl ether acetate and 2.5 parts of γ-butyrolactone).

(P-1)

PR2:

A resist composition described in Example 1 in JP-A-2003-167347, that is, a resist composition comprising 100 mass parts of resin P-2 shown below (weight average molecular weight: 10,000), 2 mass parts of an acid generator (triphenylsulfonium nonafluorobutanesulfonate), 0.2 mass parts of a basic compound (triethanolamine), and organic solvents (750 mass parts of propylene glycol monomethyl ether acetate and 30 mass parts of γ-butyrolactone).

(P-2)

PR3:

A resist composition described in Example 1 in JP-A-2002-12622, that is, a resist composition comprising 80 weight parts of resin P-3 shown below, 1 weight part of an acid generator (PAG1), 0.078 weight parts of a basic compound (TBA: tributylamine), and 480 weight parts of solvents (PGMEA: propylene glycol methyl ether acetate).

(P-3)

(x = 0.50, e = 0.50, Mw = 12,200)

(PAG 1)

PR4:

A resist composition described in Example 1 in JP-A-2003-177538, that is, a resist composition comprising 2 g of resin P-4 shown below (weight average molecular weight: 10,600), 38 mg of an acid generator (PAG2), 4 mg of a basic compound (1,5-diazabicyclo[4.3.0]-5-nonene (DBN)), 10 g of a surfactant (Megafac F176, manufactured by Dainippon Ink and Chemicals Inc.), and solvents (propylene glycol methyl ether acetate (PGMEA)/ethyl lactate=70/30, solid concentration: 14 wt %).

As shown in Table 1, the protective film-forming compositions in the invention have sufficient insolubility in water as protective films and, at the same time, sufficient solubility in an alkali developing solution. Further, as shown in Table 2, in the protective film-forming compositions in the invention, the protective films protected the resist films at the time of immersion exposure, so that patterns were obtained, but in comparative examples not having protective films, the resist patterns entirely collapsed. Further, the pattern profiles in comparative examples were unclear due to the collapse of patterns.

From these results, it can be seen that the osmosis of the immersion liquid into the inside of the resist film and the elution of the resist film components into the immersion liquid can be prevented at the time of immersion exposure without complicating the process, and an objective fine pattern can be obtained by the protective film-forming composition according to the invention.

According to a protective film-forming composition in the invention, a protective film capable of peeling off by an alkali developing solution, capable of preventing osmosis of an immersion liquid into the inside of a resist film (in particular, osmosis of water in ArF immersion lithography), and capable of preventing elution of a resist film components into an immersion liquid can be provided. Thus, the invention can provide a protective film-forming composition capable of forming a good pattern while protecting the resist film from an immersion liquid in pattern formation by immersion exposure, and provide a method of forming a pattern for immersion exposure by using the composition.

The entire disclosure of each and every foreign patent application from which the benefit of foreign priority has been claimed in the present application is incorporated herein by reference, as if fully set forth.

What is claimed is:

1. A protective film-forming composition for immersion exposure which is to be formed on a resist, the composition comprising:
    (A) a water-insoluble and alkali-soluble resin comprising a repeating unit derived from a monomer having an acid dissociation constant pKa of 8 or more; and
    (B) an organic solvent different from an organic solvent used for forming the resist.

2. The protective film-forming composition for immersion exposure as claimed in claim 1,
    wherein the repeating unit derived from a monomer has a fluoro-alcohol group.

3. The protective film-forming composition for immersion exposure as claimed in claim 1,
    wherein the repeating unit derived from a monomer has 2 or more acid groups.

4. The protective film-forming composition for immersion exposure as claimed in claim 1, further comprising a surfactant.

5. A pattern-forming method comprising:
    forming a resist film on a substrate;
    forming a protective film from the protective film-forming composition as claimed in claim 1 on the resist film;
    immersion exposing the resist film; and
    developing the exposed resist film.

6. The protective film-forming composition for immersion exposure as claimed in claim 1, wherein the organic solvent different from the organic solvent used for forming the resist is a non-aqueous solvent.

* * * * *